(12) United States Patent
Liao et al.

(10) Patent No.: US 9,006,805 B2
(45) Date of Patent: Apr. 14, 2015

(54) SEMICONDUCTOR DEVICE

(71) Applicant: United Microelectronics Corp., Hsin-Chu (TW)

(72) Inventors: Chin-I Liao, Tainan (TW); Chun-Yu Chen, Taichung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/960,816

(22) Filed: Aug. 7, 2013

(65) Prior Publication Data

US 2015/0041855 A1    Feb. 12, 2015

(51) Int. Cl.
*H01L 29/41*      (2006.01)
*H01L 29/417*    (2006.01)
*H01L 29/78*      (2006.01)

(52) U.S. Cl.
CPC ...... *H01L 29/41791* (2013.01); *H01L 29/7851* (2013.01)

(58) Field of Classification Search
CPC .......... H01L 29/66795; H01L 29/66628; H01L 29/41791; H01L 29/7851
USPC ........................................................ 257/288
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,888,181 B1 | 5/2005 | Liao | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Simon et al. | |
| 8,362,575 B2 | 1/2013 | Kwok | |
| 8,455,313 B1 * | 6/2013 | Basker et al. | 438/197 |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0108528 A1 | 5/2007 | Anderson | |
| 2007/0158756 A1 | 7/2007 | Dreeskornfeld | |
| 2008/0157208 A1 | 7/2008 | Fischer | |

(Continued)

OTHER PUBLICATIONS

Liu, Source: 2012 symposium on VLSI technology short course; Title: FinFET history, fundamentals and future, Jun. 11, 2012.

(Continued)

*Primary Examiner* — Roy Potter
*Assistant Examiner* — Paul Patton
(74) *Attorney, Agent, or Firm* — Winston Hsu; Scott Margo (57) ABSTRACT

A semiconductor device includes at least two fin-shaped structures, a gate structure, at least two epitaxial structures and a silicon cap. The fin-shaped structures are disposed on a substrate and are covered by the gate structure. The epitaxial structures are disposed at one side of the gate structure and respectively directly contact each fin-shaped structure, wherein the epitaxial structures are spaced apart from each other. The silicon cap simultaneously surrounds the epitaxial structures.

19 Claims, 6 Drawing Sheets

(56) References Cited

U.S. PATENT DOCUMENTS

| | | |
|---|---|---|
| 2009/0124097 A1 | 5/2009 | Cheng |
| 2009/0242964 A1 | 10/2009 | Akil |
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |
| 2011/0042744 A1 | 2/2011 | Cheng |
| 2011/0298058 A1 | 12/2011 | Kawasaki |
| 2013/0200470 A1 * | 8/2013 | Liu et al. .................. 257/408 |

OTHER PUBLICATIONS

Kavalieros, Source: intel corporation; Title: Tri-gate transistor architecture with high-K gate dielectrics, metal gates and strain engineering, Jun. 13, 2006.

* cited by examiner

SEMICONDUCTOR DEVICE

BACKGROUND OF THE INVENTION

1. Field of the Invention

The present invention generally relates to non-planar semiconductor devices, and more particular to non-planar semiconductor devices with epitaxial structures.

2. Description of the Prior Art

With the trend in the industry being towards scaling down the size of metal oxide semiconductor transistors (MOS), three-dimensional or non-planar transistor technology, such as the fin field effect transistor technology (Fin FET) has been developed to replace planar MOS transistors. The three-dimensional structure of a fin FET increases the overlapping area between the gate and the fin-shaped structure of the silicon substrate, and, accordingly, the channel region is more effectively controlled. The drain-induced barrier lowering (DIBL) effect and short channel effect (SCE) are therefore reduced. The channel region is also longer under the same gate length, and thus the current between the source and the drain is increased.

In another aspect, in order to further improve the devices performances, a strained-silicon technology has also been developed. The main principle in the strained-silicon technology is that strains are applied to predetermined regions within the semiconductor device which in turn make the semiconductor device work better by enabling charge carriers, such as electrons or holes, to pass through the lattice of the channel more easily. In detail, one main technology generally used in the strained-silicon technology is to dispose epitaxial structures with lattice constants different from that of the crystal silicon in the source/drain regions of the semiconductor devices. The epitaxial structures are preferably composed of silicon germanium (SiGe), carbon-doped silicon (SiC) and so forth, which have lattice constants different from that of the crystal silicon. Since the epitaxial structures have lattice constants larger or smaller than that of the crystal silicon, carrier channel regions adjacent to those epitaxial structures could sense external stresses and both the lattice structure and the band structure within these regions are altered. As a result, the carrier mobility and the performances of the corresponding semiconductor devices are improved effectively.

However, along with the continuous decrease in the size and dimensions of the semiconductor devices, there are still some newly generated technological problems that need to be overcome, even though the non-planar transistor and the strained-silicon technology are already adopted. For example, two adjacent epitaxial structures within the semiconductor device often generate unwanted lattice defects on their interfaces. Therefore, how to effectively eliminate these defects and improve the performance of the semiconductor devices are important issues in this field.

SUMMARY OF THE INVENTION

One purpose of the present invention is to provide a semiconductor device with epitaxial structures, which has few lattice defects in the epitaxial structures and has enhanced stresses imposed onto the channel region.

To this end, a semiconductor device is provided according to a preferred embodiment of the present invention. The semiconductor device includes at least two fin-shaped structures, a gate structure, at least two epitaxial structures and a silicon cap. The fin-shaped structures are disposed on a substrate and are covered by the gate structure. The epitaxial structures are disposed at one side of the gate structure and respectively directly contact each fin-shaped structure, wherein the epitaxial structures are spaced apart from each other. The silicon cap simultaneously surrounds the epitaxial structures.

Another semiconductor device is also provided according to another preferred embodiment of the present invention. The semiconductor device includes at least two fin-shaped structures, a gate structure, at least two epitaxial structures and a silicon cap. The fin-shaped structures are disposed on a substrate and are covered by the gate structure. The epitaxial structures are disposed at one side of the gate structure and respectively directly contact each fin-shaped structure, wherein there is an overlapped portion between the two adjacent epitaxial structures. The ratio of the overlapped portion to the width of each of the epitaxial structures is substantially ranging from 0.001 to 0.25. The silicon cap simultaneously surrounds the epitaxial structures.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

Figure 1:
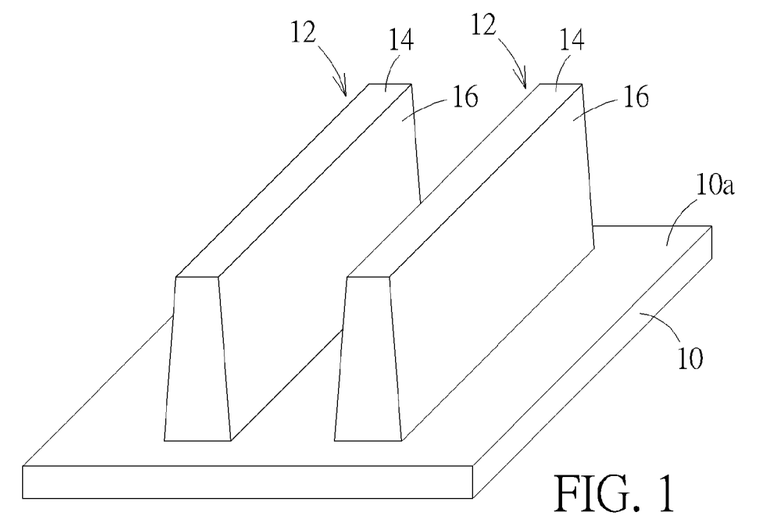
FIG. 1 to FIG. 8 are schematic diagrams showing a method for fabricating a MOSFET according to a preferred embodiment of the present invention.

FIG. 1 to FIG. 8 are schematic diagrams showing a method for fabricating a semiconductor device according to a first preferred embodiment of the present invention. Please refer to FIG. 1. FIG. 1 is a schematic perspective view showing a semiconductor device at the beginning of the fabrication process. As this stage, a semiconductor device having a substrate 10 and a plurality of fin-shaped structures 12 disposed thereon is provided. The main surface 10a of the substrate may have a specific orientation and the long axial direction of each fin-shaped structure 12 is aligned with a predetermined direction. For example, for a bulk silicon substrate, the main surface 10a of the substrate may have a orientation (100) and the long axial direction of each fin-shaped structure 12 is aligned with a direction<110>, but not limited thereto. In addition to the bulk silicon substrate, the substrate 10 may be chosen from another semiconductor substrate such as a silicon containing substrate, a III-V semiconductor-on-silicon (such as GaAs-on-silicon) substrate, or a graphene-on-silicon substrate. Preferably, the substrate 10 is not a silicon-on-insulator (SOI) substrate.

More precisely, the method for fabricating the fin-shaped structures 12 may include the following processes, but not limited thereto. First, a bulk substrate (not shown) is provided and a hard mask layer (not shown) is formed thereon. The hard mask layer is then patterned through a photolithographic and an etching process, so as to define the location for forming fin-shaped structures 12 in the bulk substrate. Afterwards, an etching process is performed to form fin-shaped structures 12 in the bulk substrate. After the above processes, the fabrication method for the fin-shaped structures 12 is complete. In this case, the fin-shaped structures 12 may be regarded as protruding from the surface 10a of the substrate 10 and the compositions of the fin-shaped structures 12 and the substrate 10 may be the same, such as monocrystalline silicon. In another case, when the substrate is chosen from a III-V semiconductor-on-silicon substrate rather than the above-mentioned bulk silicon substrate, the main compositions of the fin-shaped structures may be the same as that of the III-V semiconductor and differ from that of the underlying substrate.

In this embodiment, the hard mask layer (not shown) is optionally removed in a later process after the formation of the fin-shaped structures 12, so that a tri-gate MOSFET can be formed in the following processes. There are three contact faces 14 and 16 between each fin-shaped structure 12 and the following formed dielectric layer serving as a carrier channel region. Compared with planar MOSFETs, the tri-gate MOSFETs have a wider channel width for a same channel length. When a driving voltage is applied, the tri-gate MOSFET may produce an on-current twice higher than conventional planar MOSFETs. Alternatively, the hard mask layer (not shown) may be reserved to form a fin field effect transistor (FinFET), which is another kind of multi-gate MOSFET. Since the hard mask layer is reserved in the fin field effect transistor, there are only two contact surfaces between each fin-shaped structure 12 and the following formed dielectric layer.

Figure 2:
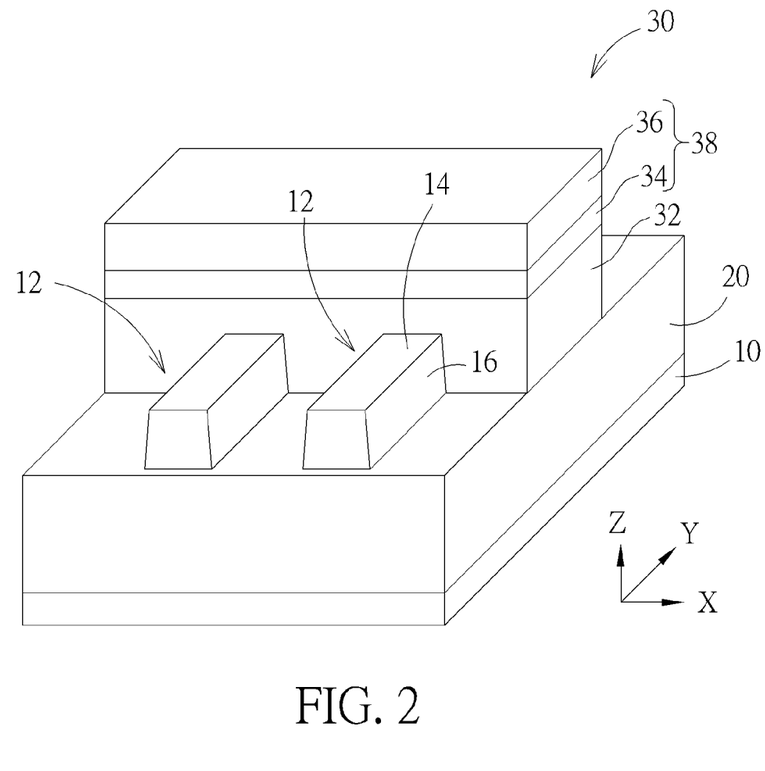

Please refer to FIG. 2. FIG. 2 is a schematic perspective diagram showing the semiconductor device after the formation of a dummy gate structure. An isolating structure 10 is formed on the substrate 10 and the lower portion of each fin-shaped structure 12 is embedded in the isolating structure 20. In this way, subsequently-formed transistors may be electrically isolated from one another by the isolating structure 20. The isolating structure 20 may have the configuration shown in FIG. 2. The isolating structure 10, for example, may be a shallow trench isolation (STI) structure, which may be formed through a STI fabrication process. Since the fabrication process for the STI structure is well-known to those skilled in the art, the detailed description of this is therefore omitted, and is not limited thereto.

Still referring to FIG. 2, in a following step, a gate dielectric layer (not shown), a sacrificial electrode layer (not shown) and a cap layer (not shown) are sequentially formed to cover the substrate 10 and the fin-shaped structures 12. Then, the gate dielectric layer, the sacrificial electrode layer and the cap layer are patterned to form a stack structure. The stack structure may be regarded as a gate structure 30 including the gate dielectric layer (not shown), the sacrificial electrode layer 32 and the cap layer 38. The gate structure 30 crosses over at least two fin-shaped structures 12 and covers the isolating structure 20 between them. Specifically, the gate structure 30 may cover a top surface 14 and two side surfaces 16 of portions of each fin-shaped structure 12, and may cover a top surface of portions of the isolating structure 20. Additionally, the gate structure 30 is preferably aligned along a first direction X, while the fin-shaped structures 12 are preferably aligned along a second direction Y and protruding from the substrate 10 along a third direction Z. In this embodiment, the first direction X, the second direction Y, and the third direction Z are mutually orthogonal to one another, but not limited thereto.

For the sake of clarity, only one gate structure 30 is depicted in FIG. 2 to FIG. 8. The number of which, however, may be increased depending on the requirements for different products. For example, more than one mutually parallel gate structure may be disposed on the substrate so that one fin-shaped structure may be concurrently covered by more than one gate structure. Besides, the same mono gate structure 30 is preferably used as a gate for transistors with the same conductivity type, like gates for PMOS transistors or gates for NMOS transistors.

In this embodiment, a gate-last for high-k last process is used so that the gate structure 30 may be regarded as a dummy gate structure. In other words, the gate dielectric layer will be replaced with a gate dielectric layer having a high dielectric constant in later processes and the sacrificial electrode layer 32 will be replaced with a conductive metal layer. Therefore, the material of the gate dielectric layer may be just a sacrificial material suitable for being removed in later processes. The sacrificial electrode layer 32 may be made of polysilicon, but not limited thereto. The cap layer 38 may be a single-layered or a multi-layered structure composed of a nitride layer or an oxide layer used to serve as a patterned hard mask. In this embodiment, the cap layer 38 is a double-layered structure composed of a bottom layer 34 and a top layer 36. The bottom layer 34 may be a nitride layer and the top layer 36 may be an oxide layer, but not limited thereto.

In the above paragraphs, a gate-last for high-k first process is used. However, the present embodiment may also adopt a gate-last for high-k last process. In this case, the gate dielectric layer is a gate dielectric layer having a high dielectric constant, which may be the group selected from hafnium oxide ($HfO_2$), hafnium silicate ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate ($SrTiO_3$), zirconium silicate ($ZrSiO_4$), hafnium zirconate ($HfZrO_4$), strontium bismuth tantalate ($SrBi_2Ta_2O_9$, SBT), lead zirconate titanate ($PbZr_xTi_{1-x}O_3$, PZT) and barium strontium titanate ($Ba_xSr_{1-x}TiO_3$, BST), but it is not limited thereto. Additionally, a barrier layer (not shown) may be formed on the gate dielectric layer to serve as an etching stop layer to protect the gate dielectric layer during the removal of the sacrificial electrode layer and to prevent above disposed metals from diffusing downwards to the gate dielectric layer and from polluting the gate dielectric layer. The barrier layer (not shown) may be a single layer structure or a multilayer structure composed of tantalum nitride (TaN) or titanium nitride (TiN) etc.

Figure 3:
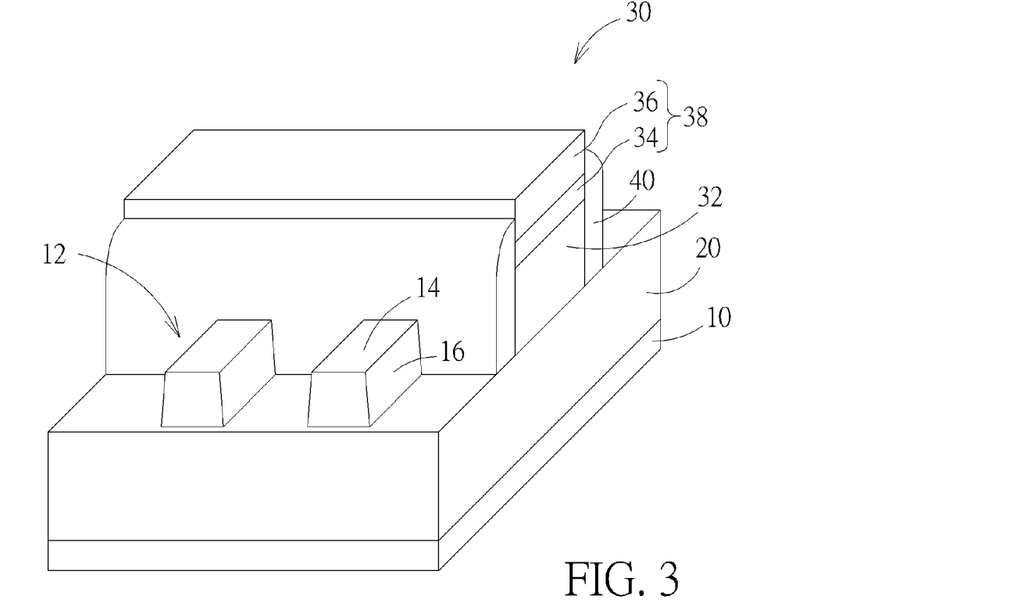

Please refer to FIG. 3. After the formation of the gate structure, at least a spacer 40 is formed on the sidewalls of the gate structure 30 to define the position of epitaxial structures. In this embodiment, the spacers 40 are respectively formed on each side of the gate structure 30 and cover portions of the isolating structure 20. More precisely, the method for forming the spacers 40 may includes the following steps. A material layer (not shown) is deposited on the gate structure 30 and the substrate 10, and then an etching process is performed to form the spacers 40. The spacers 40 may be single-layered structures, such as a silicon nitride layer or a silicon oxynitride layer, or double-layered structures, such as a silicon oxide/silicon nitride layer, but not limited thereto. In this embodiment, the spacers 40 represent spacers for defining and forming epitaxial structures, so that other spacers may be formed before/after the spacers 40 are formed to form a lightly doped source/drain region (not shown) or a source/drain region (not shown).

Figure 4:
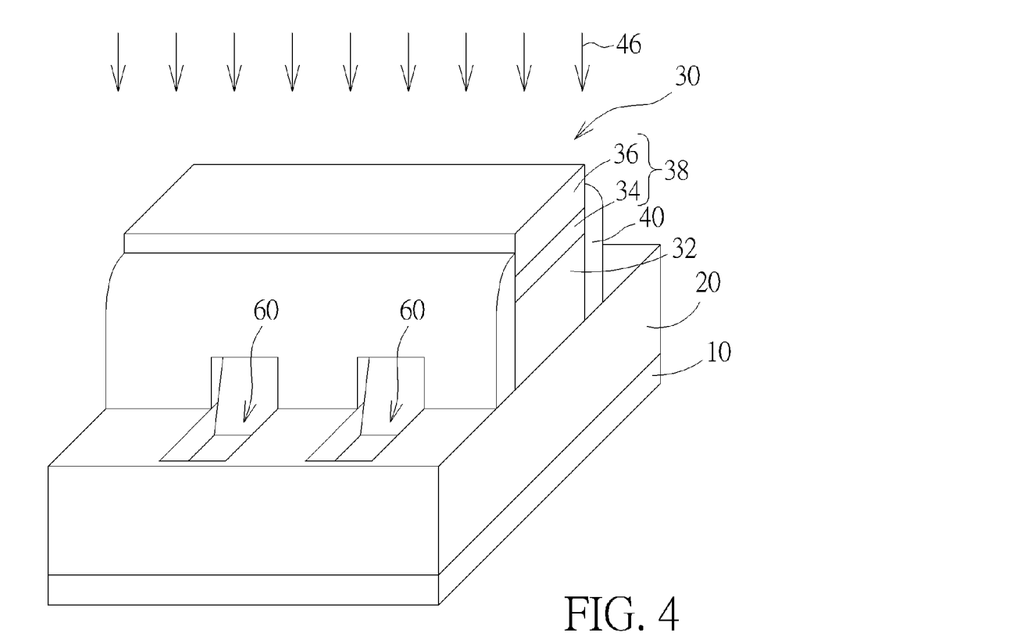

Please refer to FIG. 4. FIG. 4 is a schematic perspective view showing the semiconductor device after etching the fin-shaped structures. As shown in FIG. 4, an etching process 46 is carried out to etch the fin-shaped structures 12 under the gate structure 30 and the spacers 40. After the etching process, recesses 60 may be respectively formed in each fin structure 12 at least one side of the gate structure 30. In detail, the above etching process may include at least a dry etching step and/or at least a wet etching step. For example, the substrate 10 may be etched down to a predetermined depth through a dry etching step and then laterally etched to form a desired profile of the recess 60 through a wet etching step, but not limited thereto. In this embodiment, each recess 60 has an upwardly-curved cross-sectional profile, but not limited thereto, as the cross-sectional profile of the recess depends upon the specific requirements.

Figure 5:
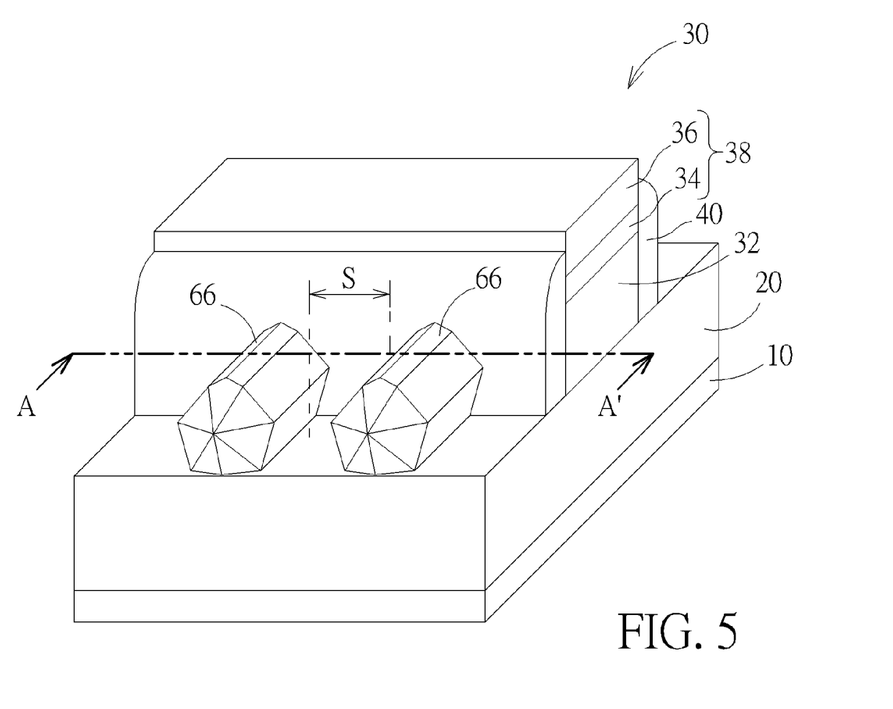
Figure 6:
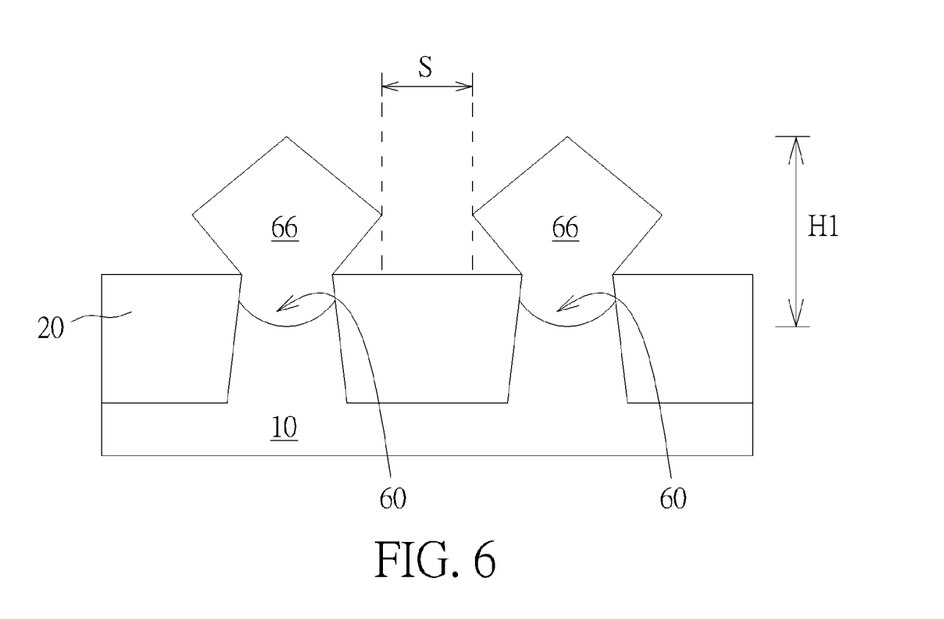

Please refer to FIG. 5 and FIG. 6. FIG. 5 is a schematic perspective view showing the semiconductor device after the formation of epitaxial structure. FIG. 6 is a schematic cross-sectional diagram taken along a line A-A' in FIG. 5. Referring to FIG. 5, after the formation of the optional recesses 60, epitaxial structures 66 are respectively formed in the corresponding recesses 60 through performing an epitaxial growth process. Preferably, two adjacent epitaxial structures 66 are disposed individually and spaced apart from each other so as to ensure that they don't merge together according to this embodiment. For example, in a case where a pitch ranges from 10 nanometers (nm) to 14 nm between two adjacent fin-shaped structures 12, when the epitaxial structures 66 have a height H1 ranging from 300 Angstroms to 600 Angstroms, a distance S ranging from 30 Angstroms to 150 Angstroms may exist between two adjacent epitaxial structures 66; that is to say, two adjacent epitaxial structures 66 don't merge together, but it is not limited thereto. In detail, the above-described epitaxial growth process may be a molecular beam epitaxy (MBE) process, a co-flow epitaxial growth process, a cyclic selective epitaxial growth process or the likes.

Furthermore, the composition of the epitaxial structure 66 may be correspondingly modified according to the conductivity types of the semiconductor devices. In this way, proper stresses could be imposed on certain regions within the semiconductor devices. For example, for a P-type semiconductor device, the epitaxial structure 66 may be a structure used to apply compressive stresses to the adjacent channel regions so that its composition may be doped or un-doped silicon germanium layer. Besides, the epitaxial structure 66 may include a multilayer or a surrounding structure with a different germanium concentration gradually varying from the inside to the outside or/and from bottom to top. For example, the epitaxial layer 66 may include epitaxial Si, at least a layer of epitaxial SiGe with a relatively low concentration of Ge, at least a layer of epitaxial SiGe with a relatively high concentration of Ge, an epitaxial Si layer and so forth, which are disposed sequentially from bottom to top. In another case, in an N-type semiconductor device, the composition of the epitaxial structure 66 may include silicon phosphorous (SiP), silicon carbide (SiC), phosphorus-doped silicon carbide or the likes, so as to provide tensile stresses to the channel regions.

Figure 7:
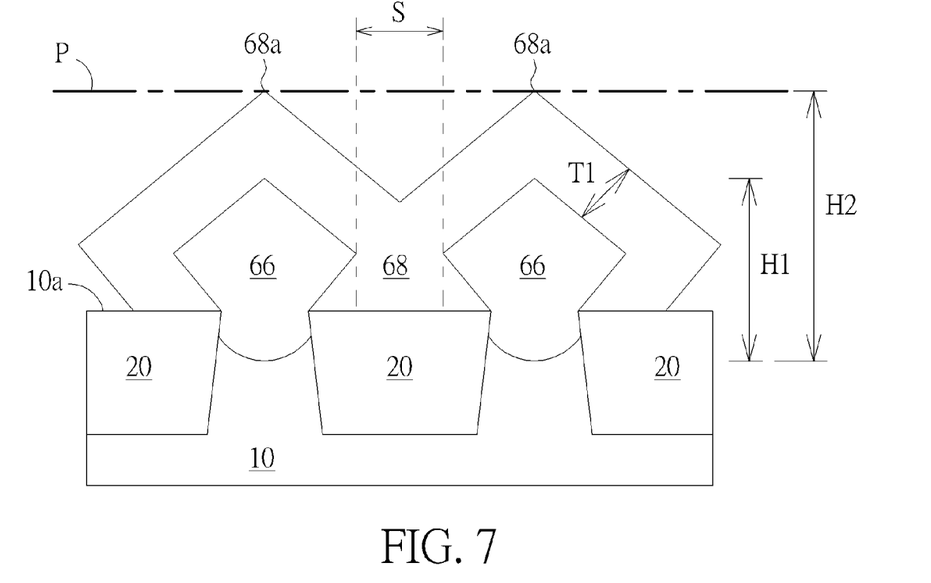

Please refer to FIG. 7. After the formation of the epitaxial structures 66, another epitaxial layer, such as a silicon cap 68 composed of monocrystalline silicon, may be formed on the surface of each of the epitaxial structures 66 through another epitaxial growth process. During the epitaxial growth process for the silicon cap 68, the silicon cap 68 continuously grows on the surface of each of epitaxial structure 66 and gradually fills up the space between two adjacent epitaxial structures 66 until two adjacent silicon caps 68 merge together as shown in FIG. 7. In other words, in order to obtain a merged silicon cap 68, the thickness T1 of the silicon cap 68 is at least greater than one-half of the distance S. For example, when the distance S ranges from 10 nm to 20 nm, the thickness T1 of the silicon cap 68 may range from 6 nm to 11 nm or may be greater than 11 nm. The actual thickness of the silicon cap 68 depends on different requirements. Still referring to FIG. 7, the merged silicon cap 68 may cover the entire surface of the epitaxial structures 66 and has an approximately periodic concavo-convex profile. In detail, the merged silicon cap 68 may have top portions 68a having the same height H2 or being in the same plane P. Besides, the plane P is substantially parallel to the main surface 10a of the substrate 10 or the isolating structure 20, but not limited thereto.

Figure 8:
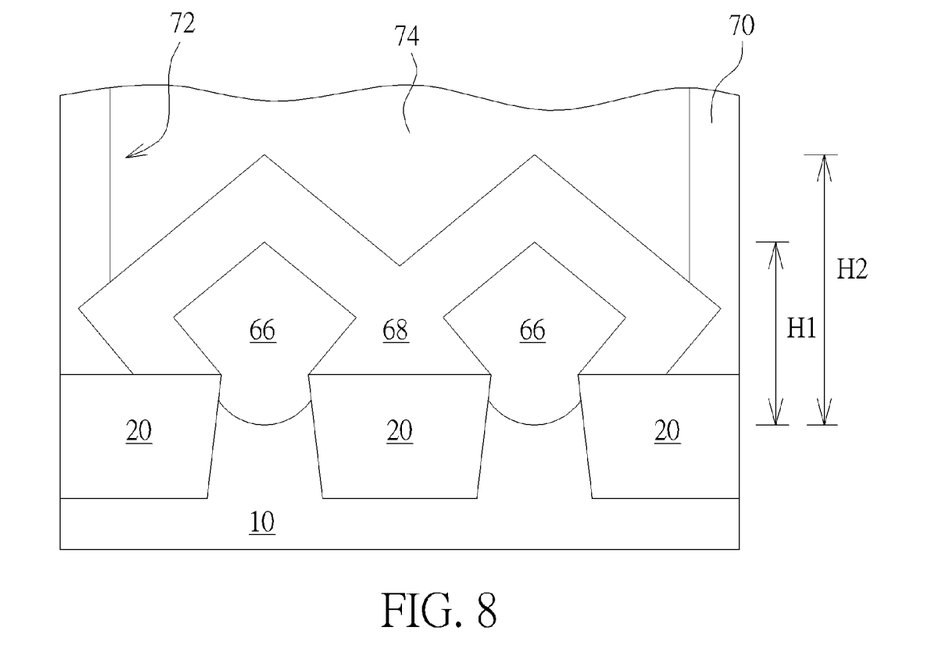

Please refer to FIG. 8. After the formation of the above epitaxial structures, the following semiconductor processes may be optionally carried out. For example, a replacement metal gate (RMG) process and a process for contact structures may be carried out sequentially. Through the RMG process, the gate structure composed of polysilicon inside may be replaced with a metal gate structure. Besides, the RMG process may be further classified into two types: a high-k first RMG process and a high-k last RMG process. The high-k last RMG process may include the following processes: (1) depositing an interlayer dielectric 70 to surround the gate structure (not shown); (2) removing the gate structure to leave a trench (not shown); (3) forming a gate dielectric layer (not shown) to conformally cover the sidewalls and the bottom of the trench; and (4) forming a metal gate (not shown) to fill up the trench. The metal gate may contain one or a plurality of metal layers such as a barrier layer (not shown), a work function metal layer (not shown), and a low-resistance metal layer (not shown), but not limited thereto.

Still referring to FIG. 8, after the RMG process, a subsequent process for contact structures may be further carried out so as to form a structure shown in FIG. 8. Precisely, the contact structures may be contact plugs 74 and are used to electrically connect the epitaxial structures 66 to the subsequently formed external circuit (not shown). The steps of forming the contact plugs 72 are described below. For example, first, at least a contact hole 72 with a circular or a slot opening is formed in the interlayer dielectric 70 so as to expose the corresponding silicon cap 68. Then, a barrier/adhesive layer (not shown) and a seed layer (not shown) are conformally filled into the contact hole 72 to cover the silicon cap 68. Afterwards, a conductive layer (not shown) is deposited to fill up the contact hole 72. In this way, a contact plug 74 filling up the contact hole 72 is obtained.

It should be noted that, in order to increase the conductivity of the silicon cap 68, a salicide process may be performed optionally during the process for forming the contact structures. For example, at the timing between forming the contact hole and filling up the contact hole with the conductive layer, a metal source layer (not shown) may be filled into the contact hole 72 and a rapid thermal anneal (RTA) process may be conducted. In this way, the metal source layer adjacent to the silicon cap 68 may partially or entirely react with the underlying silicon cap 68 so as to produce a layer of silicide layer (not shown). Then, the residual metal source layer is removed and the salicide process is accomplished. After the salicide process, the remaining process for forming contact structure may be further carried out. The metal source layer may consist of cobalt (Co), titanium (Ti), nickel (Ni), platinum (Pt), or an alloy thereof, but not limited thereto.

In the following paragraphs, several modified embodiments of the above embodiment are disclosed and the description below is mainly focused on their differences. In addition, like or similar features will usually be described with same reference numerals for ease of illustration and description thereof.

Figure 9:
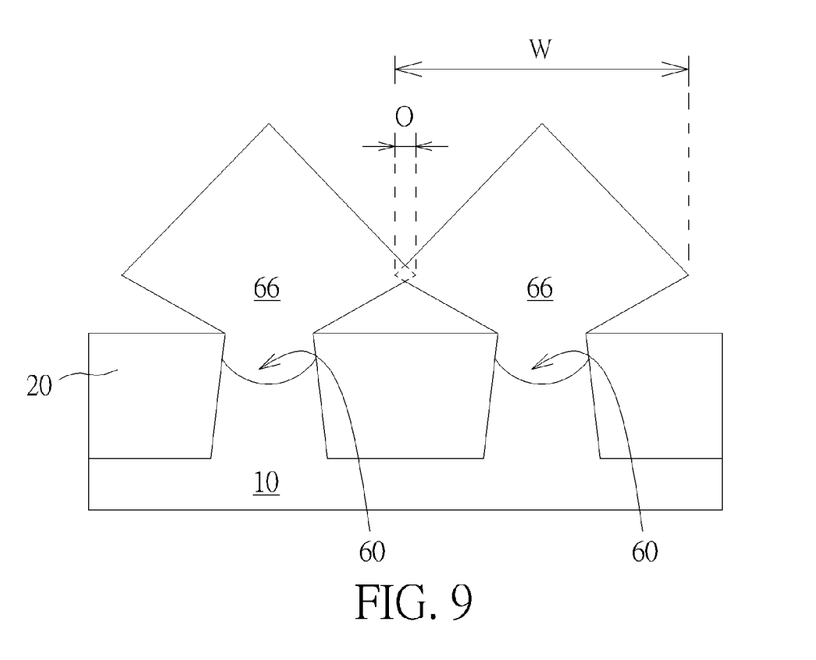
FIG. 9 to FIG. 10 are schematic diagrams showing a method for fabricating a MOSFET according to another preferred embodiment of the present invention.
Figure 10:
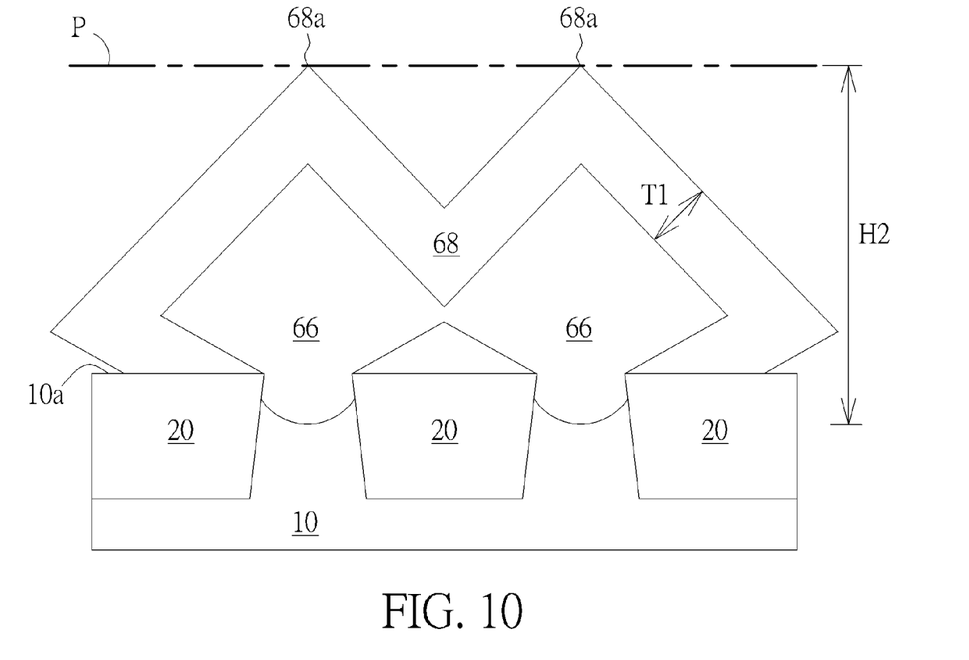

Please refer to FIG. 9 and FIG. 10. Another semiconductor device with epitaxial structures similar to the one previously described is also provided according to a modification embodiment of the present invention. However, one main difference between this modification embodiment and the above first preferred embodiment is that the epitaxial structures may merge together during the corresponding epitaxial growth process. Precisely, referring to FIG. 9, after the epitaxial growth process similar to that described in the first preferred embodiment, the epitaxial structures 66 in the respective recesses 60 may be slightly merged and constitute a consecutive epitaxial structure. Furthermore, there may be an overlapped portion O, also called connecting portion, defined between the two adjacent epitaxial structures 66 and used to physically connect them. Besides, there may be a proportional relationship between the overlapped portion O and the width W of each of the epitaxial structures 66. For example, the ratio between these dimensions (O/W) may range from 0.001 to 0.25, and preferably from 0.001 to 0.05. Under this specific ratio, even if the two adjacent epitaxial structures 66 are slightly merged, each of the epitaxial structures 66 may keep a monocrystalline structure without generating unwanted lattice defects.

Please refer to FIG. 10. After the process corresponding to FIG. 9, another epitaxial layer similar to that described in the first preferred embodiment, such as a silicon cap 68 composed of monocrystalline silicon, may be formed on the surface of each of the epitaxial structures 66 through another epitaxial growth process. It should be noted that the silicon cap 68 depicted in FIG. 10 is a consecutive layer disposed on the surface of the epitaxial structures 66 according to this modification embodiment. Therefore, the thickness T1 of the silicon cap 68 is not restricted to any specific value as long as it can constitute a consecutive layer. Similarly, the silicon cap 68 may cover the entire surface of the epitaxial structures 66 and has an approximate periodic concavo-convex profile. In detail, the merged silicon cap 68 may also have the top portions 68a having the same height H2 or being in the same plane P. Besides, the plane P is substantially parallel to the main surface 10a of the substrate 10 or the isolating structure 20, but not limited thereto.

Figure 11:
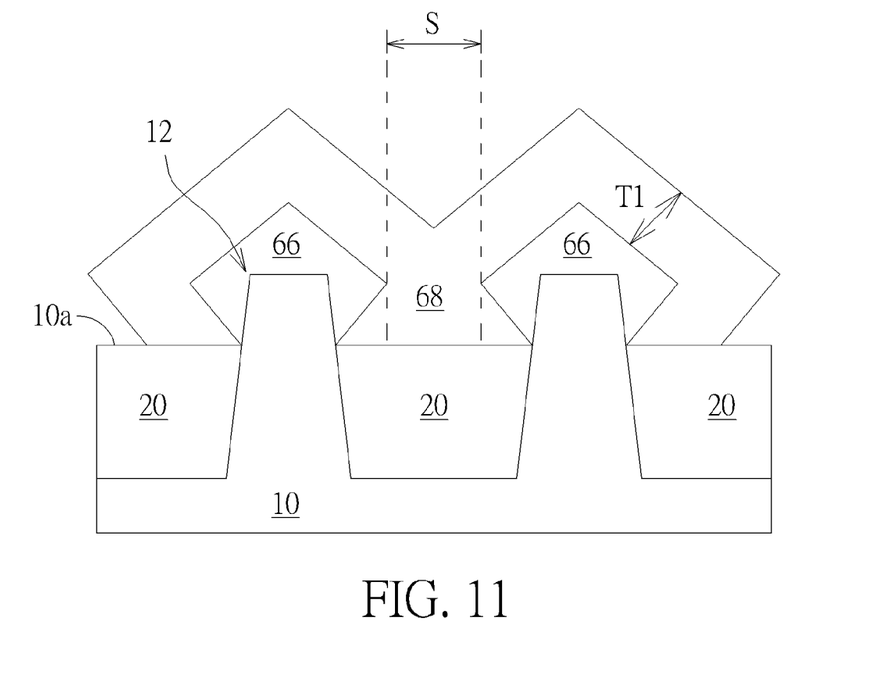
FIG. 11 is a schematic diagram showing a method for fabricating a MOSFET according to still another preferred embodiment of the present invention.

Please refer to FIG. 11. A semiconductor device with epitaxial structures similar to those of the first preferred embodiment is also provided according to another modification embodiment. However, one main difference between this modification embodiment and the above-described first preferred embodiment is that the epitaxial structures respectively directly grow on the surface of the corresponding fin-shaped structures. That is to say, there are no recesses in the fin-shaped structures. Precisely, referring to FIG. 11, since an etching process for forming the recesses is not carried out according to this modification embodiment, the epitaxial structures 66 formed in the subsequent epitaxial growth process may directly cover the corresponding fin-shaped structures 12 and there is a distance between two adjacent epitaxial structures 66. Similarly, another epitaxial layer, such as silicon cap 68 composed of monocrystalline silicon, may be formed on each of the epitaxial structures 66 in a subsequent process. The silicon caps 68 may continuously grow on the epitaxial structures 66 so that the two adjacent silicon caps 68 could merge together. This structure is depicted in FIG. 11. Alternatively, the epitaxial structures may be slightly merged prior to the formation of the silicon cap so that the subsequent formed silicon cap is no longer merged in this case. Since the structure and the fabrication processes described in this modification embodiment are mostly similar to those described in the first preferred embodiment, the detailed description of those is therefore omitted for the sake of clarity.

It should be noted that, according to the above embodiments, the epitaxial structures and the silicon cap covering thereon are preferably disposed in source/drain regions of semiconductor devices with the same conductivity type. For example, the epitaxial structures made of SiGe and the overlaying silicon caps are all disposed in P-type semiconductor devices and are at least disposed in source/drain regions at one side of the gate structures.

To summarize, each preferred embodiment or modification embodiment of the present invention provides a semiconductor device. In these semiconductor devices, the two adjacent epitaxial structures are spaced apart from each other or slightly merged together. In the first case, another epitaxial layer disposed on the epitaxial structures may fill up the space between the two adjacent epitaxial structures. In the latter case, another epitaxial layer may constitute a continuous layer disposed on the surface of the epitaxial structures. In either case, no lattice defects exist in the epitaxial structures or in the overlapped region between two adjacent epitaxial structures. As a result, stresses provided by the epitaxial structures are increased and the performances of the semiconductor devices are enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   at least two fin-shaped structures, disposed on a substrate;
   a gate structure, covering the fin-shaped structures;
   at least two epitaxial structures, disposed at one side of the gate structure and respectively directly contacting each fin-shaped structure, wherein the epitaxial structures are spaced apart from each other; and
   a silicon cap, simultaneously surrounding the epitaxial structures.

2. The structure according to claim 1, further comprising at least two recesses, respectively disposed at an end of each of the fin-shaped structures, wherein each of the epitaxial structures respectively fills up each of the recesses.

3. The structure according to claim 1, wherein the epitaxial structures respectively cover an end of each of the fin-shaped structures.

4. The structure according to claim 1, further comprising at least an insulating layer, disposed between the epitaxial structures.

5. The structure according to claim 4, wherein the silicon cap directly covers the insulating layer between the epitaxial structures.

6. The structure according to claim 1, wherein each of the epitaxial structures comprises a low doped epitaxial layer, a high doped epitaxial layer and a liner.

7. The structure according to claim 1, wherein a composition of each of the epitaxial structures comprises silicon germanium, silicon phosphide or silicon carbide.

8. The structure according to claim 1, wherein each of the epitaxial structures comprises a top portion and the top portions are substantially in a same plane.

9. The structure according to claim 1, wherein the silicon cap has a concavo-convex profile.

10. The structure according to claim 1, wherein a material of the silicon cap is monocrystalline silicon.

11. The structure according to claim 1, further comprising:
a dielectric layer, covering the gate structure and the silicon cap; and
at least a contact structure, disposed in the dielectric layer and in direct contact with the silicon cap.

12. A semiconductor device, comprising:
at least two fin-shaped structures, disposed on a substrate;
a gate structure, covering the fin-shaped structures;
at least two epitaxial structures, disposed at one side of the gate structure and respectively directly contacting each fin-shaped structure, wherein there is an overlapped portion between the two adjacent epitaxial structures and each of the epitaxial structures has a width, wherein a ratio of the overlapped portion to the width of each of the epitaxial structures substantially ranges from 0.001 to 0.25;
a silicon cap, simultaneously surrounding the epitaxial structures; and
a space, located between the substrate and the epitaxial structures, wherein the space is filled with the silicon cap.

13. The structure according to claim 12, further comprising at least two recesses, respectively disposed at an end of each of the fin-shaped structures, wherein each of the epitaxial structures respectively fills up each of the recesses.

14. The structure according to claim 12, wherein the epitaxial structures respectively cover an end of each of the fin-shaped structures.

15. The structure according to claim 12, wherein each of the epitaxial structures comprises a low doped epitaxial layer, a high doped epitaxial layer and a liner.

16. The structure according to claim 12, wherein a composition of each of the epitaxial structures comprises silicon germanium, silicon phosphide or silicon carbide.

17. The structure according to claim 12, wherein the silicon cap has a concavo-convex profile.

18. The structure according to claim 12, wherein a material of the silicon cap is monocrystalline silicon.

19. The structure according to claim 12, further comprising:
a dielectric layer, covering the gate structure and the silicon cap; and
at least a contact structure, disposed in the dielectric layer and in direct contact with the silicon cap.

* * * * *